United States Patent [19]

Orlandi

[11] Patent Number: 4,897,148
[45] Date of Patent: Jan. 30, 1990

[54] APPARATUS FOR REMOVING ADHESIVE TAPE WRAPPED AROUND A PRINTED CIRCUIT BOARD

[75] Inventor: Ivano Orlandi, Turate, Italy

[73] Assignee: Orlandi Aldo e Orlandi Ivano S.d.f., Como, Italy

[21] Appl. No.: 260,050

[22] Filed: Oct. 20, 1988

[30] Foreign Application Priority Data

Oct. 27, 1987 [IT] Italy ............................... 22415-A/87

[51] Int. Cl.$^4$ ........................................... B32B 31/18
[52] U.S. Cl. ................................... 156/584; 156/344; 156/510
[58] Field of Search ................ 156/344, 584, 510

[56] References Cited

U.S. PATENT DOCUMENTS 4,466,849  8/1984  Dantsker .................... 156/584 X
4,724,032  2/1988  Kay ............................. 156/584 X Primary Examiner—Robert A. Dawson
Assistant Examiner—James J. Engel, Jr.
Attorney, Agent, or Firm—Robbins & Laramie

[57] ABSTRACT

To remove adhesive tape wrapped around a printed circuit board, a taped board is caused to advance along a predetermined travel path; along that path, the adhesive tape is cut along the leading and trailing edges of the board, and then pried up and clamped at opposite corners of the leading edge, to eventually become removed simultaneously from both major faces of the board.

10 Claims, 8 Drawing Sheets

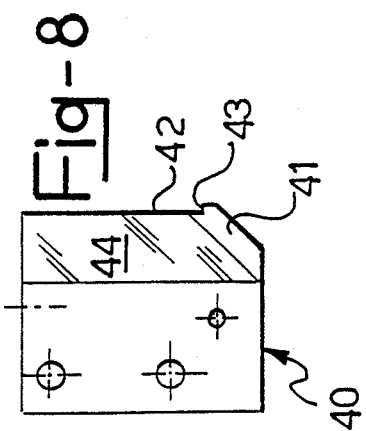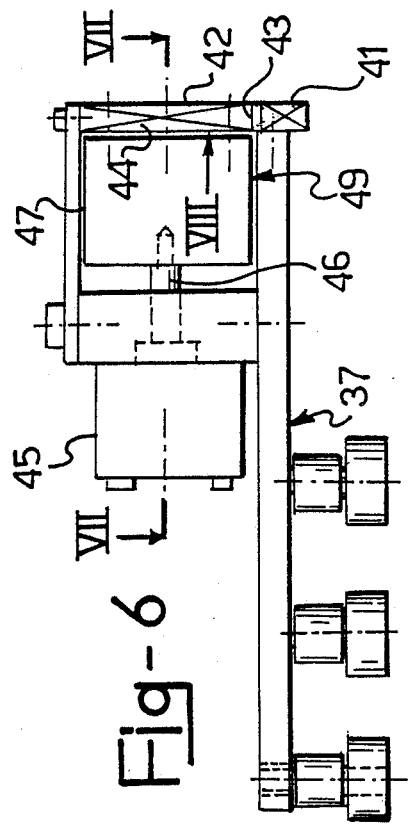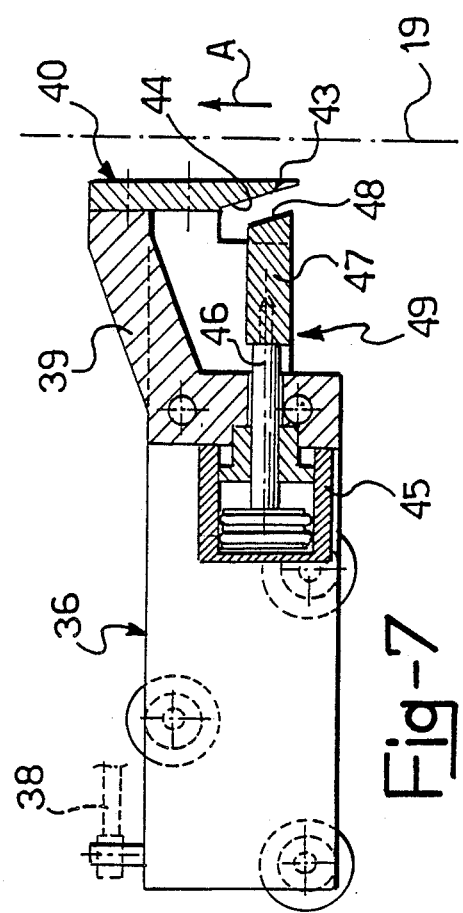

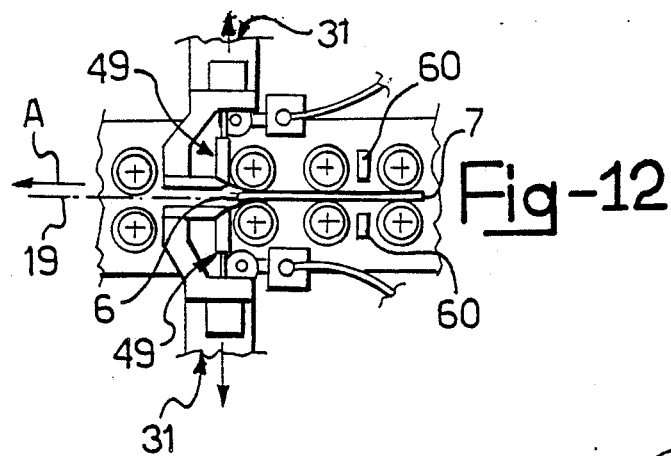
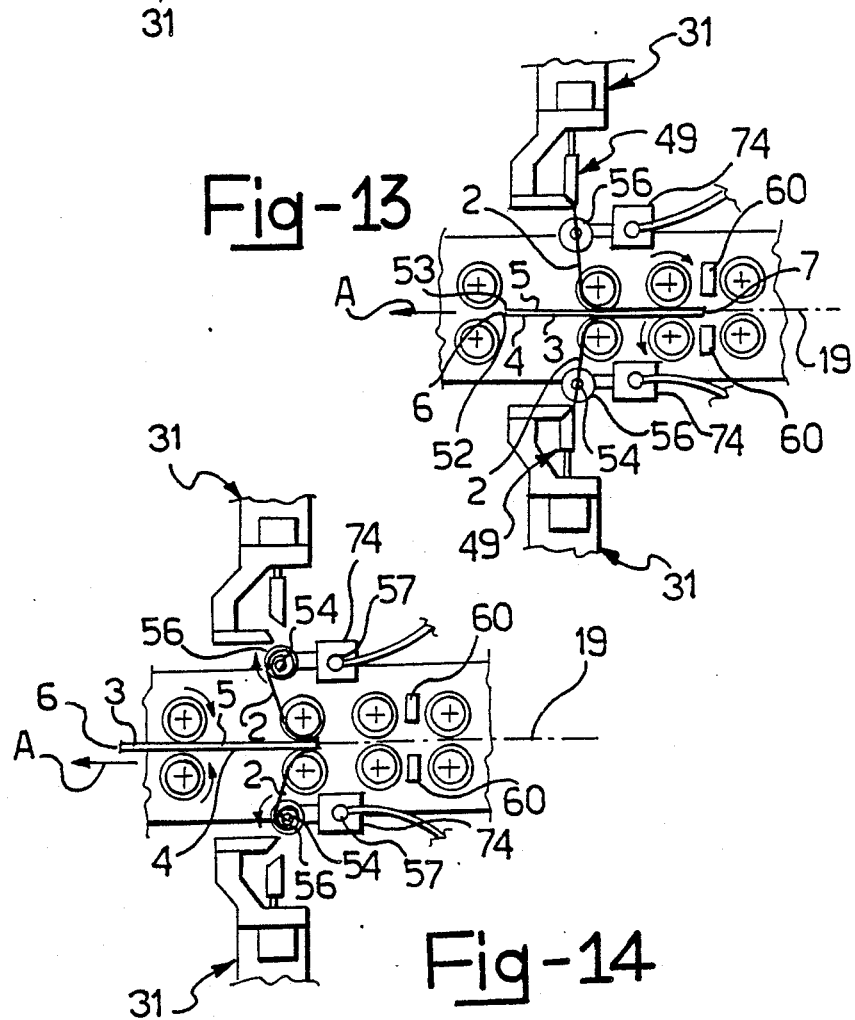

4,897,148

APPARATUS FOR REMOVING ADHESIVE TAPE WRAPPED AROUND A PRINTED CIRCUIT BOARD

DESCRIPTION

This invention relates to a method of removing an adhesive tape wrapped around a printed circuit board.

As is known, in the manufacture of printed circuits, supporting boards are employed which are formed from an insulating material usually comprising layers of paper and phenolic resins, or alternatively, layers of glass fiber and epoxy resins, on which metallic linking lines are then formed.

The linking lines are usually made of copper, and in order to prevent their corrosion, they require to be coated with suitable metals, the connectors being, in particular, subjected to a gold or nickel plating process by means of a galvanic bath, for example.

Preparatory to the galvanic deposition of gold or nickel thereon, the plates are wrapped in an adhesive tape, which is generally 25 to 100 mm wide, to protect the areas adjacent the connectors against the chemical attack from the various solutions used for galvanic deposition.

Once the connectors have been gold plated, the adhesive tape is removed from the board, and the latter is then subjected to surface finishing and machining operations.

It is current practice to have the adhesive tape removed manually by an operator, which involves significant slow-downs on the printed circuit assembly line and aggravates costs to a considerable extent.

Further, the adhesive tape removed from the boards collects into a bulky, sticky mass that poses appreciable problems for its disposal.

The problem underlying this invention is to provide a method of removing adhesive tape wrapped around a printed circuit board, which has such characteristics as to obviate the drawbacks affecting the prior art.

This problem is solved, according to the invention, by a method as indicated being characterized in that it comprises the steps of, causing a taped board to move along a predetermined path, as laid with the tape direction aligned to said path;

cutting the tape at leading and trailing edges of the board;

simultaneously prying up two respective flaps of the cut tape at two opposed corners of the leading edge; and clamping said flaps and peeling off the tape simultaneously from two opposite major faces of the board.

Advantageously in accordance with this invention, the method includes the steps of reeling up the tape as it is peeled off the major faces of the board.

The features and advantages of a method according to the invention will be more clearly understood from the following detailed description of a preferred embodiment thereof, to be taken by way of illustration and not of limitation in conjunction with an apparatus depicted in the accompanying drawings. In the drawings:

FIG. 6 is a side view of a detail of FIG. 1;

FIG. 7 is a plan view of the detail shown in FIG. 6 as sectioned along the line VII—VII;

FIG. 8 is a fragmentary view taken in the direction of the arrow VIII;

FIGS. 9 to 14 are fragmentary plan views showing schematically the apparatus of this invention at successive stages of its operation.

Figure 1:
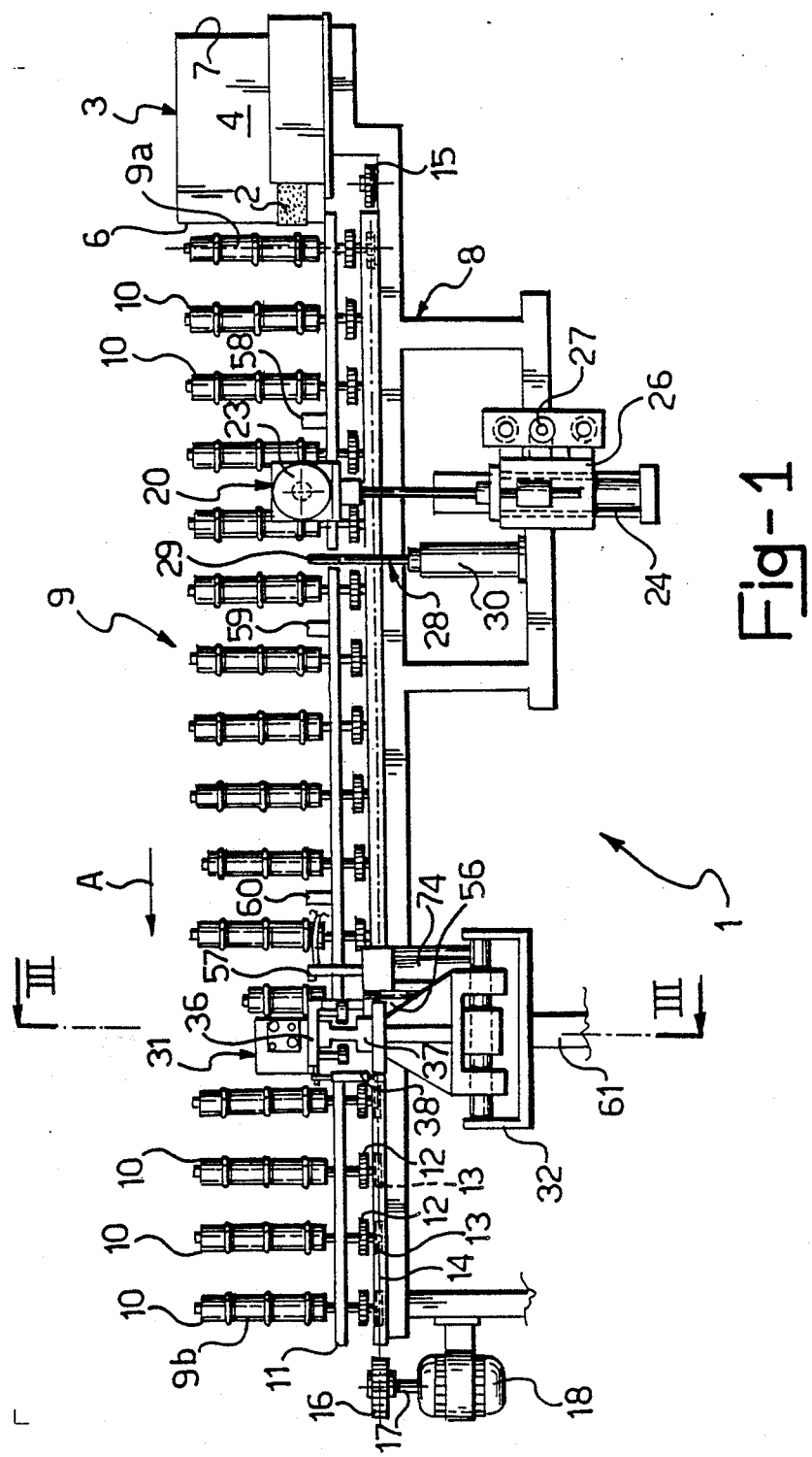
FIG. 1 is an elevation view showing schematically an apparatus for implementing the method of this invention.

With reference to the drawing views, the numeral 1 comprehensively designates an apparatus according to the invention for removing an adhesive tape 2 which has been wrapped around a printed circuit board 3. More specifically, the adhesive tape 2 would be wound around to cover two opposite major faces 4 and 5 and two opposite, respectively leading and trailing, edges 6 and 7 of the taped board 3, as further explained hereinafter.

The apparatus 1 comprises a structure 8 supporting a runway 9 equipped with roller pairs, collectively designated 10. The rollers 10 lie parallel to one another in a vertical direction, and have a bottom end journalled through an elongate horizontal table 11 extending within the structure 8.

The rollers 10 of each pair are provided at the bottom, beneath the table 11, with respective gears 12 of a type allowed to rotate in a single direction and in mutual mesh engagement thereby the rollers of each pair are rotatively coupled together. In addition, each roller 10 is provided, at the bottom end thereof, with a respective pinion gear 13 driven rotatively by a drive chain 14 stretched between two sprocket wheels, respectively an idler wheel 15 mounted to the structure 8 and a driving wheel 16 keyed to a drive shaft 17 of a motive means 18 carried on an opposed side of the structure 8.

It should be noted that the rollers 10 of each pair are set mutually apart, thereby a specifically selected path 19 is defined between the rollers which is straight and lies horizontally, along which path a taped board 3, as laid edge-on on the table 11 with the tape 2 direction aligned to the path 19, is guided drivingly along a feeding direction indicated by the arrow A in the drawing figures, from an inlet end 9a of the roller runway 9 to an opposite outlet end 9b.

Relatively to said feeding direction, there are defined, therefore, the leading edge 6 and trailing edge 7 of the board 3.

The apparatus 1 further comprises a first cutter means 20 for mechanically cutting the tape 2 along the leading edge 6 of the taped board 3. The first cutter means 20 is mounted in the path 19 downstream of the inlet end 9a, and consists of a cylindrical milling cutter 21 having a horizontal axis of rotation, perpendicular to the path 19, and being mounted on a spindle 22 of an electric servomotor 23 effective to drive the cutter at a high rotational speed.

The servomotor 23 is carried on an air-operated cylinder-piston assembly extending in a vertical direction and operative to move the cutter 21 vertically toward and away from a bottom travel end position whereat the cutter is lowered, through a specially provided opening 25, to a level below the table 11 and retracted away from the path 19 of the board 3.

The cylinder-piston assembly 24 is mounted on a holder 26 supported on the structure 8 in a horizontally adjustable way by means of a screw 27, toward and away from the path 19.

Indicated at 28 is a second cutter means mounted on the structure 8 in the path 19, downstream from the first cutter means 20, for cutting the tape 2 thermally along the trailing edge 7 of the board 3. The second cutter means 28 comprises a high-temperature electric resistance heater 29 being configured substantially U-like and movable vertically through the table 11 under the action of a cylinder 30.

The apparatus 1 also comprises two stations, each indicated generally at 31, designed to pry up and remove the adhesive tape 2, as previously cut along the edges 6 and 7, from the major faces 4 and 5 of a taped board 3.

The two stations 31 are identical with each other and arranged mirror image-like with respect to the path 19, downstream from the second cutter means 28.

The stations 31 are mounted on a frame 32 extending transversely of the path 19 and being carried on the structure 8 at a lower level than the roller runway 9, said frame being movable vertically by a motive means 33.

In particular, affixed to the ends of the frame 32, at the stations 31, are two feed rods 61 extending in a vertical direction and fitting slidably into respective vertical guide sleeves 62 mounted to the structure 8.

Figure 3:
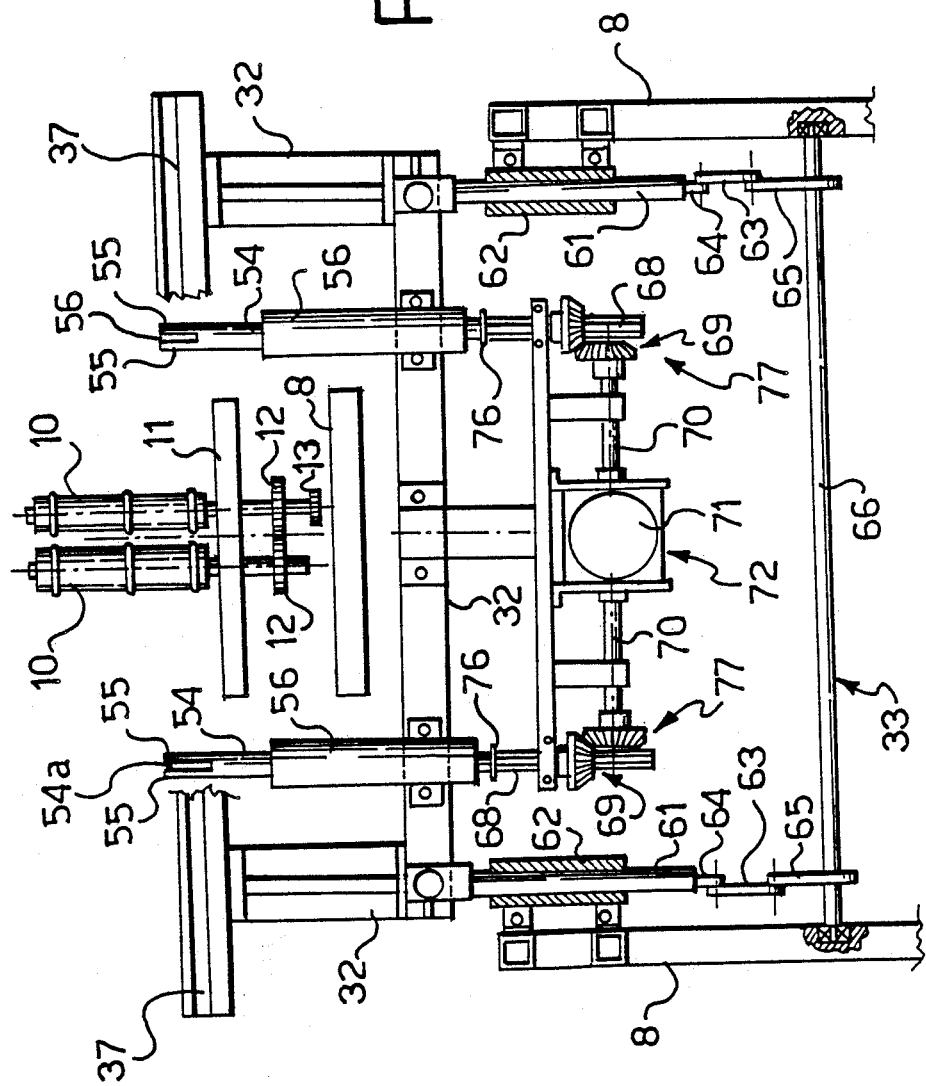
FIG. 3 is a schematical fragmentary section view taken to an enlarged scale along the line III—III in FIG. 2.
Figure 5:
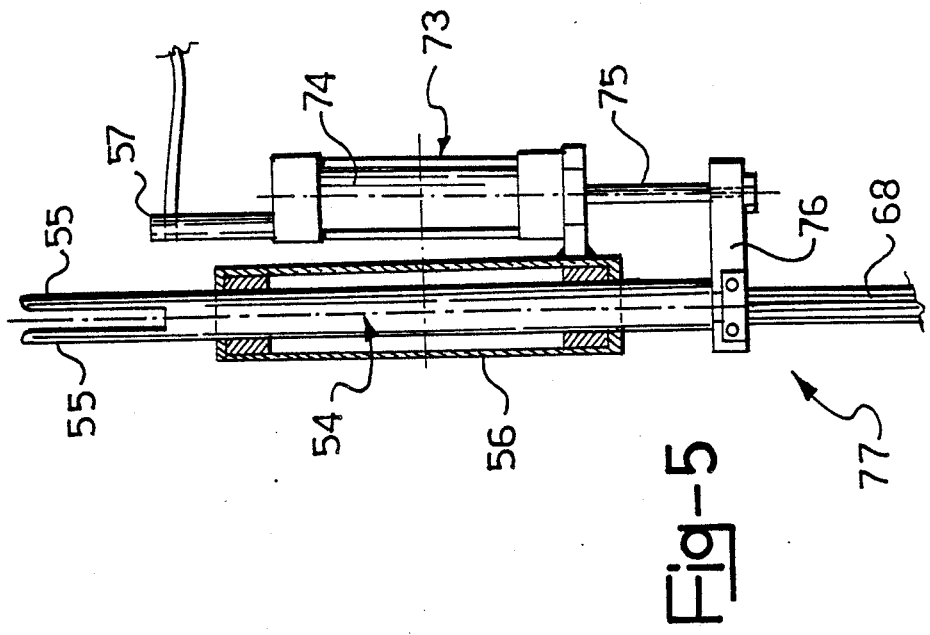
FIG. 4 and 5 are enlarged scale side views of respective details of FIG. 1.
Figure 4:
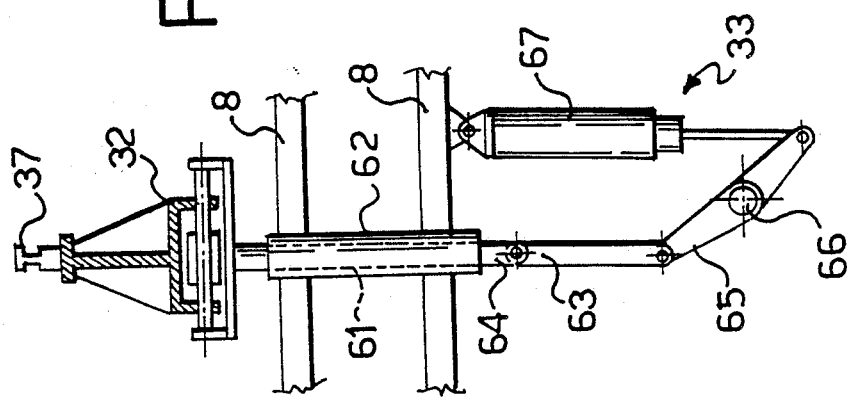

Indicated at 63 is, for each feed rod 61, a first lever having one end journalled to a bottom end 64 of the feed rod 61 and the other end journalled to a second lever 65 which is keyed centrally on a rod 66 journalled on the structure 8 and extending horizontally parallel to the frame 32 (see FIGS. 3 and 4).

Indicated at 67 is an air cylinder assembly supported on the structure 8 and associated with the second lever 65 to move the rod 66 angularly about its longitudinal axis, and accordingly, raise and lower the frame 32 together with the stations 31 along the vertical tubes 62.

The above-mentioned motive means 33 is therefore composed of the assembly 67, the rod 66, and the first 63 and second 65 levers.

Each station 31 comprises a slide 36 mounted for a sliding movement on a guide 37 supported on the frame 32 and extending horizontally across the path 19.

Indicated at 38 is an air cylinder mounted between the slide 36 and the frame 32 to drive the slide along the guide 37.

The slide 36 has an arm 39 facing toward the path 19, and affixed to one end of said arm is a blade 40 extending vertically parallel to the path 19.

Advantageously, the blade 40 comprises a first cutting edge 41 formed at a bevel provided at a bottom corner of the blade 40 and having an inclination setting of about 45° from vertical and facing toward the table 11 and the inlet end 9a of the roller runway 9.

The blade 40 further comprises a second vertical cutting edge 42 adjacent the first cutting edge 41, which is formed on a side of the blade facing the inlet end 9a. A top corner of the first cutting edge 41 is arranged to protrude relatively to the second cutting edge 42 to define a step 43 between the first and second cutting edges.

Also defined on the blade 40, at the second cutting edge 42, is a face 44 set at an acute angle to the blade and facing the slide 36.

Also mounted on the slide 36 is a cylinder assembly 45 having a piston rod 46 facing toward the blade 40. Affixed to one end of the piston rod 46 is a small block 47 whose height corresponds substantially to that of the second cutting edge 42 and having a side 48 facing the face 44 and set at an angle parallel thereto.

Under the action of the cylinder assembly 45, the block 47 can be driven toward and away from an operative gripping position whereat its side 48 is placed to press on the face 44.

It should be noted that, at either stations 31, the cylinder assembly 45, block 47, and face 44 constitute a clamping means 49 adapted to clamp on a respective flap 50,51 of the tape 2 as cut along the leading edge 6 and pried up by the first cutting edge 41 at a respective vertical corner 52,53 of the leading edge 6, which corners respectively adjoin the major face 4 and major face 5 of the board 3.

Each station 31 further comprises a respective pivot pin 54 which extends in a vertical direction and has a top end 54a bifurcated into two parallel spaced-apart prongs 55 whose length corresponds substantially to the width of the tape 2.

Each pivot pin 54 is mounted coaxially and pivotally through a respective cylindrical holder 56 attached to the movable frame 32; in addition, the pivot pin 54 is slidable within said holder 56 from an extended position whereat the prongs 55 are drawn fully out of the holder to a retracted position with the prongs 55 drawn fully inside the holder 56.

The reference numeral 68 designates a bottom end section of the pivot pin 54 which is fluted lengthwise and extends outwards from the holder 56.

Both fluted sections 68 are associated, through respective bevel gear drives 69, with a horizontal output shaft 70 of a single ratiomotor 71 carried on the movable frame 32.

It should be noted that the fluted sections 68 are mounted in a freely slidable way along a vertical direction relatively to the drives 69 which constitute, in combination with the ratiomotor 71, a first motive means 72 for driving the pivot pins 54 rotatively about their axes.

Also provided is a second motive means 73 for driving the pivot pins 54, relatively to the holders 56, vertically from their extended positions to their retracted positions, and vice versa. Such second motive means 73 comprises, for each pivot pin 54, a respective upright air cylinder 74 secured on the holder 56 and having a piston rod 75 oriented downwards.

The pivot pin 54 is associated with the air cylinder 74 by a bracket 76, affixed to the rod 75, on which the pivot pin 54 is journalled with a portion thereof which locates above the fluted section 68.

It should be noted that the pivot pin 54 is located in the travel path of the tape 2 as the latter is being removed from the major faces 4 and 5 of the board 3 by the clamping means 49, thereby it is caught in between the prongs 55 during the upward movement from the retracted position inside the holder 56 to the extended position.

Taken together, the pivot pin 54, first motive means 72, and second motive means 73 constitute a means, designated 77, which is mounted to each station 31 to catch and roll on itself the tape 2 being peeled off the board 3.

Indicated at 57 is a blower nozzle mounted on the cylinder/piston 74,45, aimed at the pivot pin 54, and connected to an air system not shown.

The apparatus 1 further comprises three air operated grippers 58, 59, 60, carried on the table 11 and laid along the path 19 astride it to hold a taped board 3. In particular, the first gripper 58 is located between two roller pairs 10 upstream of the first cutter means 20 to stop a board 3 at said first cutter means and enable the tape 2 to be cut along the leading edge 6; the second gripper 59 is located downstream from the second cutter means 28 to enable the tape 2 to be cut along the trailing edge 7; and the third gripper 60 is located upstream of the stations 31 to stop the board 3 while the flaps 50 and 51 are being pried up by the first sloping cutting edges 41, as will be explained hereinafter.

Also provided are two receptacles, not shown, for receiving tape 2 removed from the boards 3, which are located in the proximities of the stations 31.

A method according to this invention will be described herein below for removing adhesive tape wrapped around a printed circuit board, which method is implemented on the apparatus 1 just discussed.

Figure 2:
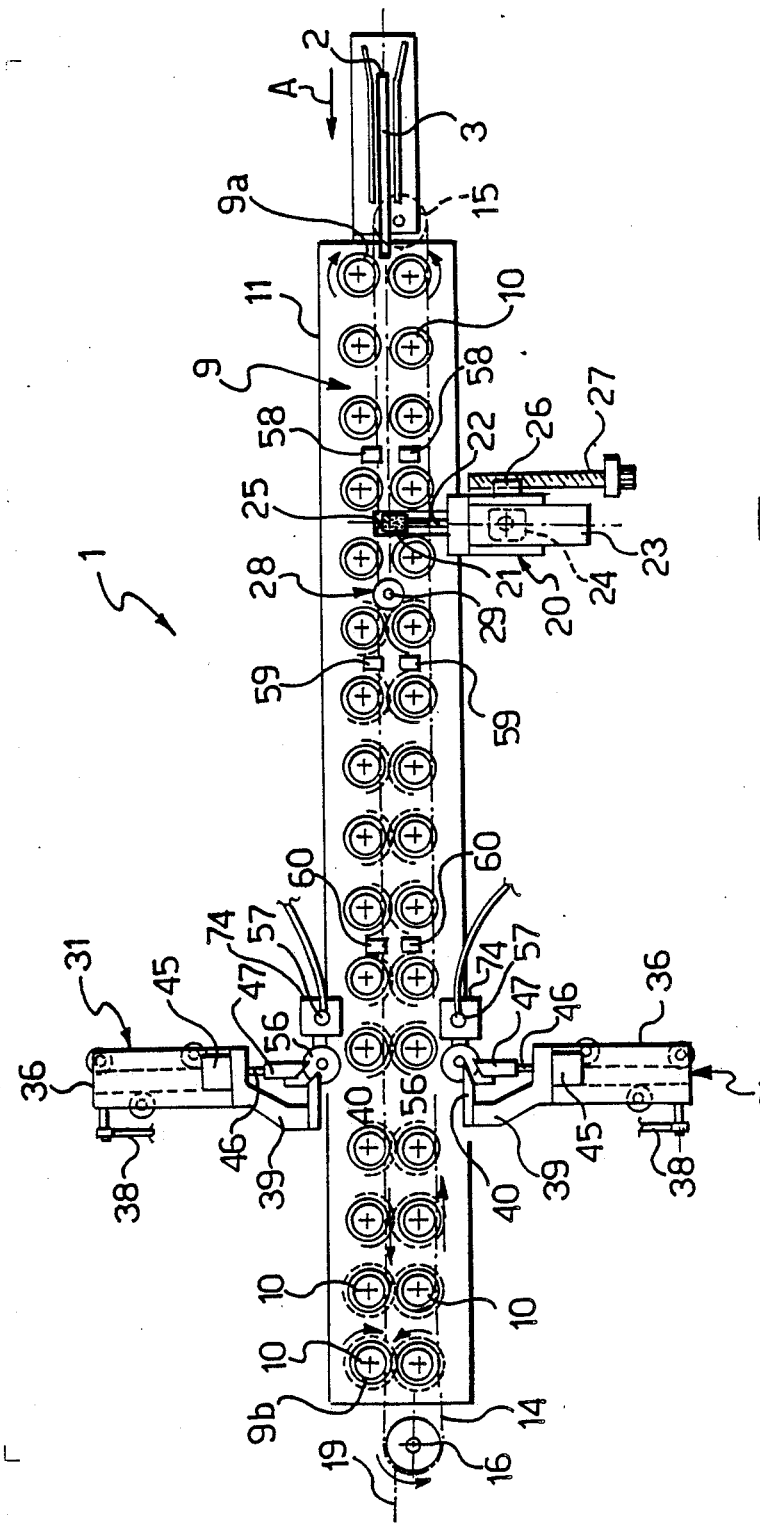
FIG. 2 is a fragmentary plan view of the apparatus shown in FIG. 1.

In accordance with the method of this invention, a taped board 3 is first fed onto the roller runway 9 from the inlet end 9a, the board 3 being then driven forward along the path 19 with the tape 2 wound around it extending colinearly with the path itself (see FIGS. 1 and 2).

Figure 9:
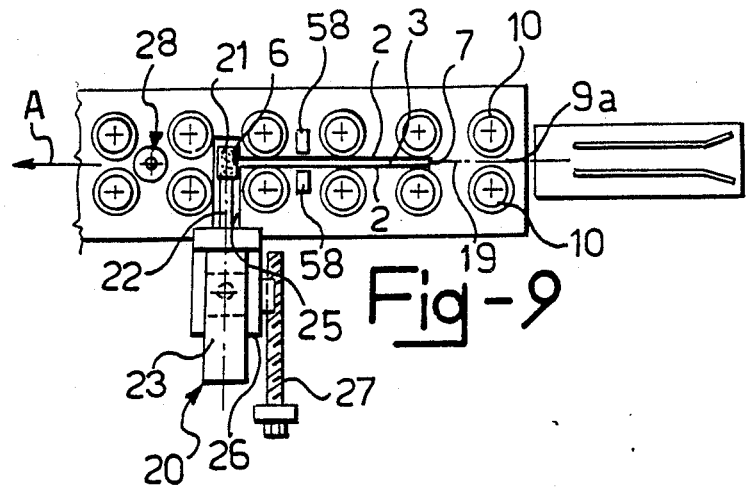

On the leading edge 6 of the board 3 reaching the first cutter means 20, the first gripper 58 are controlled to close on the board to stop its movement, and a mechanical cutting step is performed on the tape 2 along the leading edge 6 by means of a high-speed cylindrical cutter 21, to provide a clean cut (see FIG. 9).

On completion of the tape cutting operation, the first gripper 58 is released, the cutter 21 is brought to the bottom travel end position whereat it is retracted beneath the table 11 away from the path 19, and in accordance with the invention, the successive step is carried out whereby the tape 2 is cut thermally along the trailing edge 7 of the board 2. This is accomplished by again stopping the board 3, presently by means of the second gripper 59, with the trailing edge 7 located at the second cutter means 28, and then sliding the electric resistance heater 29 at a high temperature along said, trailing edge (see FIGS. 10 and 11).

After this cut is completed, the second gripper 59 is released, and the board allowed to resume its movement in the direction A along the path 19, until its leading edge 6 reaches the stations 31, where the board is again stopped by the third gripper 60.

At this time, the step is performed whereby the respective flaps 50, 51 of the cut tape 2 are simultaneously pried up at the vertical corners 52, 53. Accordingly, the frame 32 is moved up by operating the motive means 33 and at the same time driving both slides 36 simultaneously toward the path 19 along their respective guides 37 by means of the air cylinders 38, until the first sloping cutting edge 41 of the blades 40 is brought to contact the respective major faces 4 and 5 of the board 3, at the corners 52 and 53 and above the tape 2.

The motive means 33 is presently operated to bring the frame 2 back down, thereafter the blades 40 of the stations 31 and the first sloping cutting edges 41 will pry up the flaps 50, 51 of the tape 2.

The downward movement of the blades 40 is stopped on the step 43 between the first 41 and second 42 cutting edges locating beneath the tape 2.

It is important to observe that at this time the flaps 50 and 51 will overlie the faces 44 of the second cutting edges 42 (see FIG. 8).

Then, by operating the cylinder assemblies 45, the small blocks 47 are pushed against the blades 40, and the flaps 50 and 51 clamped and retained in between the faces 44 and the sides 48 of said blocks 47 which constitute the aforementioned clamping means 49 (see FIGS. 6 and 7).

In accordance with this invention, the tape 2 is then peeled simultaneously off both major faces, 4 and 5, of the board 3, by driving the slides 36 away from the path 19 and at the same time releasing the third gripper 60, thereby the board 3 is allowed to resume its movement in the direction A.

Figure 10:
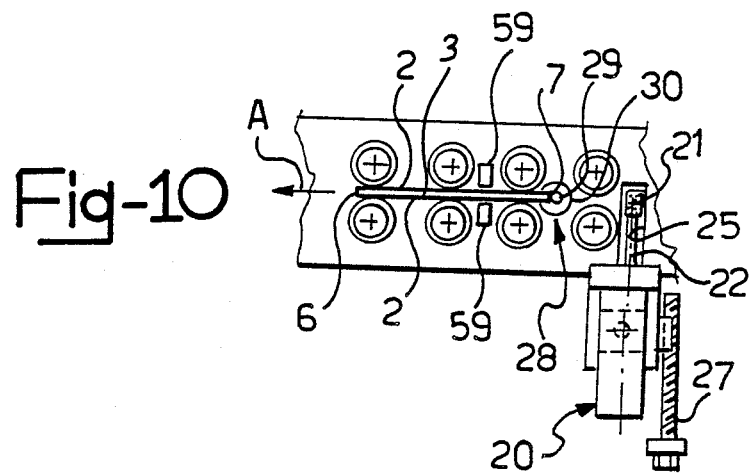
Figure 11:
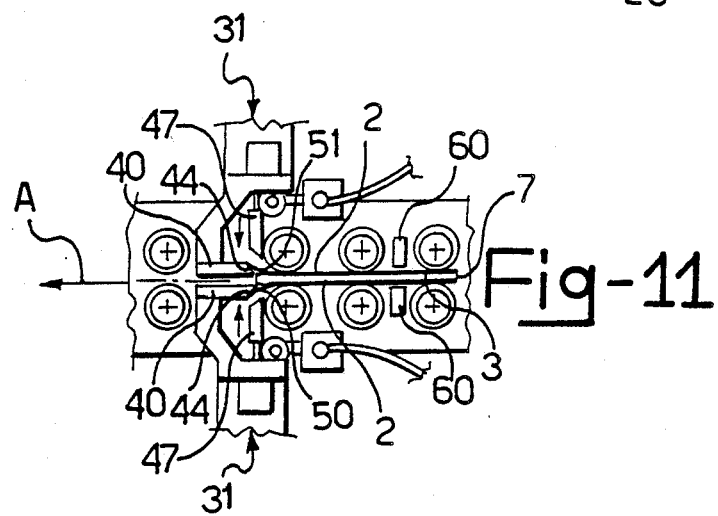
Figure 11A:
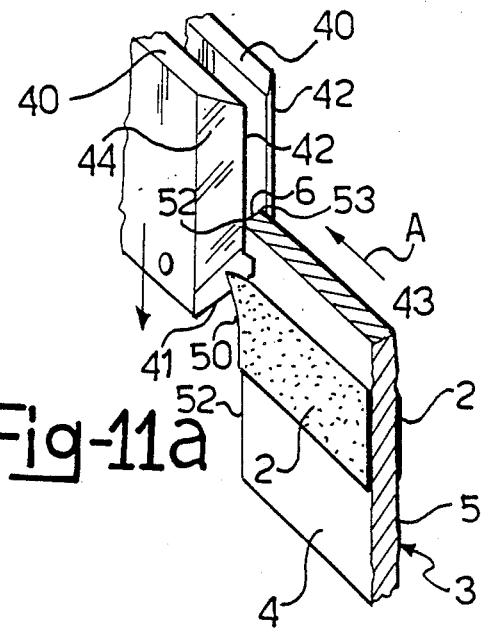
FIGS. 11a and 13a are fragmentary perspective views of the apparatus shown in FIG. 1 corresponding respectively to the stages depicted in FIGS. 11 and 13.
Figure 13A:
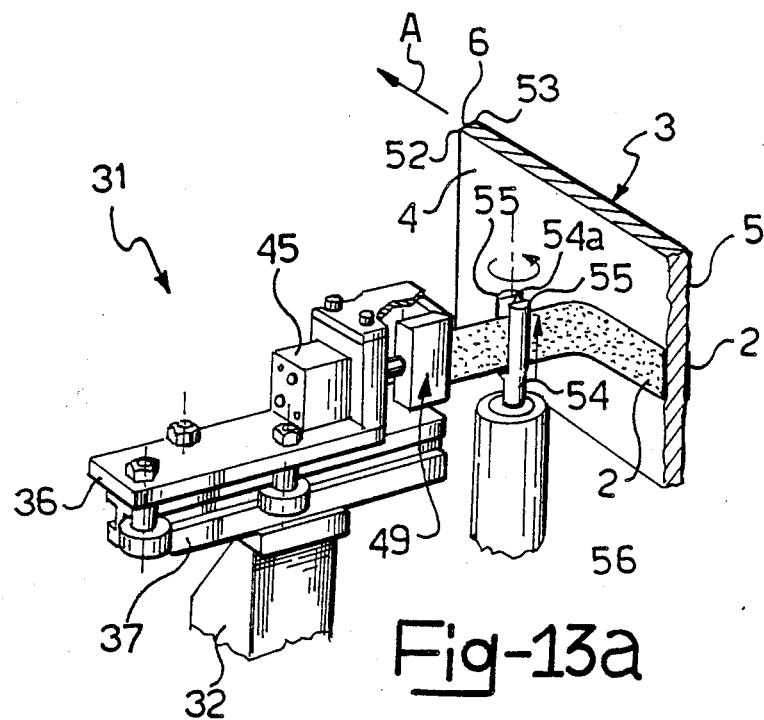

Advantageously, as the tape 2, still partly attached to the board 3 and with the flaps 50 and 51 clamped in the clamping means 49, locates above the pivot pins 54, the latter are simultaneously raised to their extended positions by means of the second motive means 73, such that the tape 2 is caught in between the prongs 55 (see FIGS. 10 and 10a).

At this time, the pivot pins 54 will be rotated about their axes by means of the first motive means 72, and simultaneously therewith, the clamping means 49 is released to free the flaps 50 and 51 of the tape 2, the tape being accordingly rolled up (see FIG. 11) to eventually provide, after the removal of tape from the major faces 4 and 5 has been completed, two separate rolls of tape.

The pivot pins 54 are then retracted out of the way into the holders 56 to leave the rolls of tape 2 onto the holders themselves; subsequently, the tape rolls will be dropped off the holders 56 into the receptacles located at the stations 31 by means of air jets issuing from the nozzles 57.

The method according to this invention for removing adhesive tape from printed circuit boards has proved to be surprisingly effective and practical to implement.

Furthermore, for the purpose of disposing the removed tape, specially advantageous has shown to be the reeling of lengths of that tape into compact, non-sticky rolls of small size.

The apparatus for implementing the inventive method has afforded the major advantage that it lends readily to full control from a central control device, thus providing for safe and reliable fully automated operation at a fast rate.

I claim:

1. An apparatus for removing an adhesive tape wrapped around a printed circuit board, characterized in that it comprises a table extending within a supporting structure, a runway having mutually spaced-apart parallel roller pairs and being mounted on said table to guide a taped board along a predetermined travel path, first and second cutter means carried on said structure at said travel path and movable away therefrom, two stations whereat said tape is pried up, clamped, and removed, said stations being supported on said structure downstream from said cutter means and arranged in mirror image relationship astride said travel path, each said station including a blade mounted on a slide movable transversely toward and away from said travel path, and gripper means mounted on said slide and associated with said blade.

2. An apparatus according to claim 1, characterized in that said first cutter means comprises a milling cutter.

3. An apparatus according to claim 1, characterized in that said second cutter means comprises an electric resistance heater.

4. An apparatus according to claim 1, characterized in that said stations are mounted on a frame supported on said structure and being movable toward and away from said table by the action of motive means.

5. An apparatus according to claim 4, characterized in that said blade comprises a first cutting edge set at an angle to said table.

6. An apparatus according to claim 5, characterized in that said blade comprises a second cutting edge set perpendicularly to said table and adjoining said first cutting edge.

7. An apparatus according to claim 6, characterized in that said blade is formed with a face sloping at said second cutting edge, said face being arranged to confront said slide.

8. An apparatus according to claim 7, characterized in that the clamping means include said face and a small block associated with a cylinder assembly effective to position it removably in pressure contact relationship with said face.

9. An apparatus according to claim 1, characterized in that it comprises a means, mounted to each said station, for catching and rolling up said tape.

10. An apparatus according to claim 9, characterized in that said means includes a pivot pin having a substantially bifurcate end, a first motive means acting on said pin to rotate it about its axis, and a second motive means for moving said pin axially toward and away from a position whereat said end interferes with said tape.

* * * * *